US009425395B2

(12) United States Patent
Ahn

(10) Patent No.: US 9,425,395 B2
(45) Date of Patent: Aug. 23, 2016

(54) METHOD OF FABRICATING A VARIABLE RESISTANCE MEMORY DEVICE

(71) Applicant: SAMSUNG ELECTRONICS CO., LTD., Suwon-Si, Gyeonggi-Do (KR)

(72) Inventor: Junku Ahn, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/794,932

(22) Filed: Jul. 9, 2015

(65) Prior Publication Data
US 2016/0104841 A1 Apr. 14, 2016

(30) Foreign Application Priority Data
Oct. 14, 2014 (KR) .................. 10-2014-0138431

(51) Int. Cl.
H01L 45/00 (2006.01)
(52) U.S. Cl.
CPC ........ *H01L 45/1683* (2013.01); *H01L 45/1641* (2013.01)
(58) Field of Classification Search
CPC .................. H01L 45/1641; H01L 45/1683
See application file for complete search history.

(56) References Cited

U.S. PATENT DOCUMENTS

| 7,803,654 | B2 | 9/2010 | Lee et al. |
| 7,932,614 | B2 | 4/2011 | Codding et al. |
| 8,828,845 | B2 | 9/2014 | Kang et al. |
| 8,841,152 | B2 | 9/2014 | Bahlke et al. |
| 8,877,530 | B2 | 11/2014 | Seong |
| 2009/0275188 | A1* | 11/2009 | Park ................. H01L 45/06 438/478 |
| 2011/0155992 | A1 | 6/2011 | Kao et al. |
| 2012/0049107 | A1 | 3/2012 | Park et al. |
| 2014/0021512 | A1 | 1/2014 | Lee et al. |
| 2014/0061694 | A1 | 3/2014 | Leirer et al. |
| 2014/0102643 | A1 | 4/2014 | Porneala et al. |

FOREIGN PATENT DOCUMENTS

| KR | 10-2001-0065308 A | 7/2001 |
| KR | 10-2003-0057697 A | 7/2003 |
| KR | 10-2004-0004873 A | 1/2004 |
| KR | 10-2008-0076254 A | 8/2008 |
| KR | 10-2012-0087664 A | 8/2012 |

OTHER PUBLICATIONS

Takaya et al. ("Laser Planarization Process Assisted by Chemical Mechanical Polishing for Copper Surface", American Society for Precision Engineering Annual Meeting, pp. 537-540, 2001).*
X J Su et al., "Shock-induced brittle cracking in HVPE-GaN processed by laser lift-off techniques", Journal of Physics D: Applied Physics 64 (2013), pp. 1-6.

(Continued)

Primary Examiner — Yasser A Abdelaziez
(74) Attorney, Agent, or Firm — Volentine & Whitt, PLLC

(57) ABSTRACT

A method of fabricating a variable resistance memory device includes preparing a substrate having a lower electrode, forming a mold layer on the substrate, patterning the mold layer to form an opening, forming a variable resistance layer having a first portion in the opening and a second portion disposed on a top surface of the mold layer, and separating the second portion of the variable resistance layer from the first portion by irradiating the variable resistance layer to form a variable resistance element in the opening.

17 Claims, 15 Drawing Sheets

(56) References Cited

OTHER PUBLICATIONS

Jaeyi Chun et al., "Laser lift-off transfer printing of patterned GaN light-emitting diodes from sapphire to flexible substrates using a Cr/Au laser blocking layer," 2014 Acta Materialia Inc. Published by Elsevier Ltd., pp. 13-16.

W.S. Wong et al., "Integration of GaN Thin Films with Dissimilar Substrate Materials by Pd—In Metal Bonding ans Laser Liftoff," Journal of Electronic Materials, pp. 1-20.

* cited by examiner

METHOD OF FABRICATING A VARIABLE RESISTANCE MEMORY DEVICE

PRIORITY STATEMENT

This U.S. non-provisional patent application claims priority under 35 U.S.C. §119 to Korean Patent Application No. 10-2014-0138431, filed on Oct. 14, 2014, in the Korean Intellectual Property Office, the disclosure of which is hereby incorporated by reference in its entirety.

BACKGROUND

The inventive concepts relate to a method of fabricating a variable resistance memory device.

Next-generation semiconductor memory devices have been developed to increase performance while lowering power consumption. These next-generation semiconductor memory devices include ferroelectric random access memory (FRAM) devices, magnetic random access memory (MRAM) devices, and phase-change random access memory (PRAM) devices. Materials of the next-generation semiconductor memory devices have resistances that vary depending on an applied current and/or an applied voltage. In addition, the materials of the next-generation semiconductor memory devices may have a non-volatile characteristic in that the resistance value is maintained even though the power supplied thereto is interrupted.

The PRAM devices of these variable resistance memory devices are being developed because of their high operating speeds and because their structures allow for the device architecture to possess a high integration density.

SUMMARY

According to one aspect of the inventive concepts, a method of manufacturing a variable resistance memory device includes providing a substrate on which a lower electrode is disposed, forming a mold layer on the substrate, patterning the mold layer to form an opening, forming on the mold layer a variable resistance layer having a first portion in the opening and a second portion extending over a top surface of the mold layer, and separating the second portion of the variable resistance layer from the first portion to thereby form a variable resistance element in the opening. The separating of the portions of the variable resistance layer from one another comprises irradiating the variable resistance using a laser.

According to another aspect, a method of manufacturing a variable resistance memory device includes providing a substrate on which a lower electrode is disposed, forming a mold layer on the substrate, patterning the mold layer to form an opening, forming on the mold layer a variable resistance layer having a first portion in the opening, an air pocket in the first portion, and a second portion extending over a top surface of the mold layer, and irradiating the variable resistance layer with light emitted by a laser to cause the second portion of the variable resistance layer to flow into the opening and thereby form a variable resistance element in the opening.

According to another aspect, a method of manufacturing a variable resistance memory device includes forming a mold layer on the substrate, patterning the mold layer to form an opening in the mold layer, forming a blanket variable resistance layer on the mold layer to such a thickness that the variable resistance layer extends within the opening and over a top surface of the mold layer, and forming a variable resistance element in the opening by removing at least all of the variable resistance layer that extends over the top surface of the mold layer and leaving some of the variable resistance layer within the opening. The forming of the variable resistance layer comprises irradiating the variable resistance layer.

BRIEF DESCRIPTION OF THE DRAWINGS

The inventive concepts will become more apparent in view of the attached drawings and accompanying detailed description.

FIGS. 3 to 13 illustrate a first embodiment of a method of fabricating a variable resistance memory device according to the inventive concepts wherein:

FIGS. 3, 4, 5, 6, 8, 9, 10, 11, 12 and 13 are each a cross-sectional view of the device during the course of its manufacture as taken along the direction of line I-I' of FIG. 2, FIG. 7 is a schematic diagram of apparatus for use in fabricating the device, FIGS. 8, 9 and 10 show different results of the process step shown in and described with reference to FIGS. 6 and 7, and FIGS. 11, 12 and 13 illustrate process steps carried out subsequently to the results attained in FIGS. 8, 9 and 10, respectively;

DETAILED DESCRIPTION OF THE PREFERRED EMBODIMENTS

Figure 1:
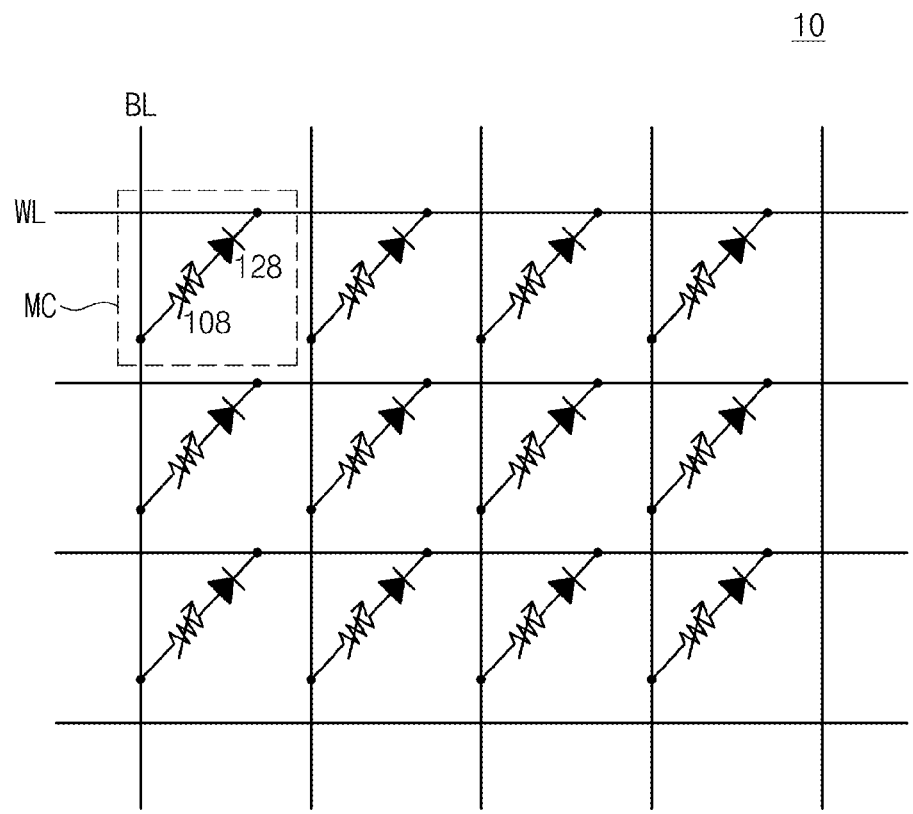
FIG. 1 is a circuit diagram illustrating a memory cell array of variable resistance memory devices which may fabricated according to the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer or portion thereof, region or substrate is referred to as being "on" or "over" another element, it can be directly on or over the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Terms are to be given their broadest reasonable meaning per definitions widely excepted in the art or in normal usage. For instance, the term "irradiate" will be understood to mean to shed rays of light upon or heat with radiant energy.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a circuit diagram of a memory cell array of a variable resistance memory device which may be fabricated according by embodiments according to the inventive concepts.

Referring to FIG. 1, the semiconductor device is a variable resistance memory device 10. Furthermore, the variable resistance memory device 10 may include a plurality of memory cells MC arranged in a matrix. Each of the memory cells MC may include a selection element 108 and a variable resistance element 128. The selection element 108 may be connected between the variable resistance element 128 and a word line WL, and the variable resistance element 128 may be connected between a bit line BL and the selection element 108.

The selection element 108 controls the current flowing to the variable resistance element 128 according to a voltage of the word line WL. In an example of the present embodiment, the selection element 108 is a PN junction diode.

The variable resistance element 128 may include a phase-change material, a ferroelectric material, or a magnetic material. A state of the variable resistance element 128 depends on the amount of a current supplied through the bit line BL.

Hereinafter, an example will be described in which the variable resistance element 128 include phase-change material, i.e., an example will be described in which the variable resistance memory device 10 is a phase-change memory device. However, it will be readily apparent as to how the inventive concepts may be applied to a resistance random access memory (RRAM) device, a ferroelectric RAM (FRAM) device, and a magnetic RAM (MRAM) device.

In this example, the resistance of the phase-change material of the variable resistance element 128 changes according to changes in its temperature. In particular, the phase-change material may have an amorphous state or a crystalline state depending on its temperature and/or the amount of time it is allowed to cool. In its amorphous state the phase-change material may have a relatively high resistance, and its crystalline state the phase-change material may have a relatively low resistance. The phase-change material of the variable resistance element 128 may be heated by Joule's heat that is generated by and in an amount corresponding to the amount of current supplied through a lower electrode. The temperature of the Joule's heat may be in proportion to a specific resistance of the phase-change material and/or the duration over which the current is supplied to the variable resistance element 128.

A first embodiment of a method of fabricating a variable resistance memory device according to the inventive concept will be described in detail with reference to the plan view of FIG. 2 and the cross-sectional views of FIGS. 3 to 13 which are taken along a direction of line I-I' of FIG. 2.

Figure 2:
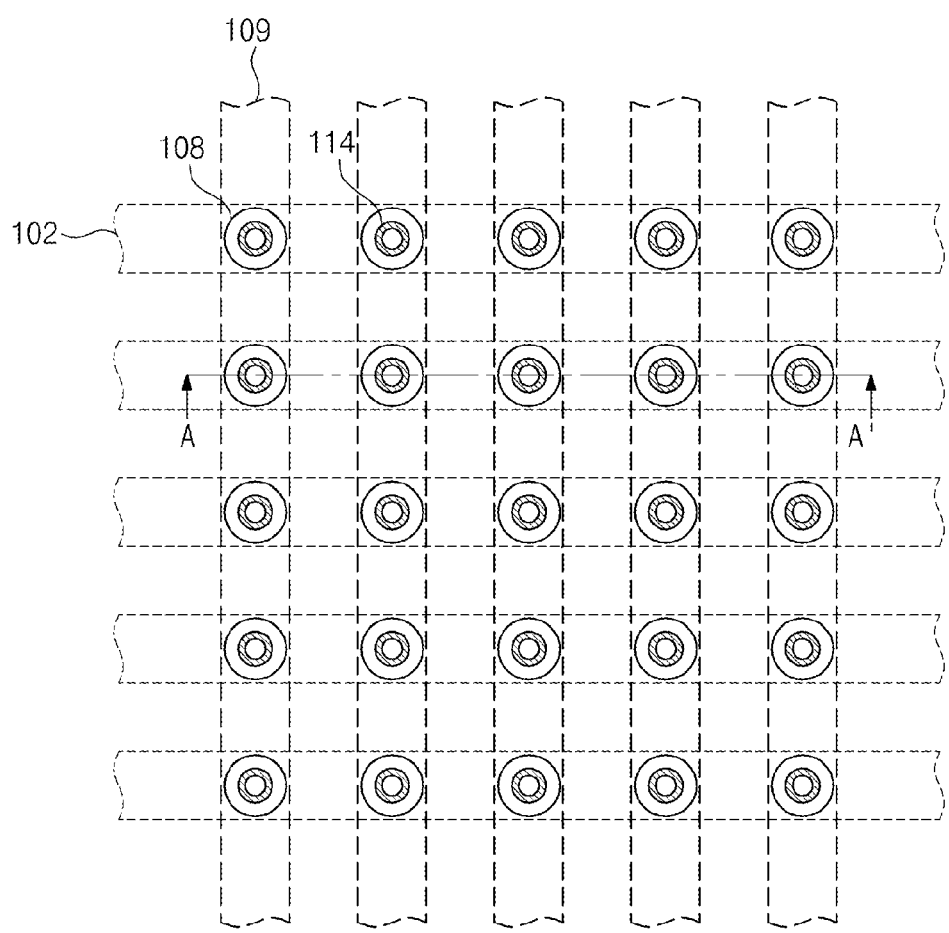
FIG. 2 is a plan view of variable resistance memory devices which may be fabricated according of the inventive concepts.
Figure 3:
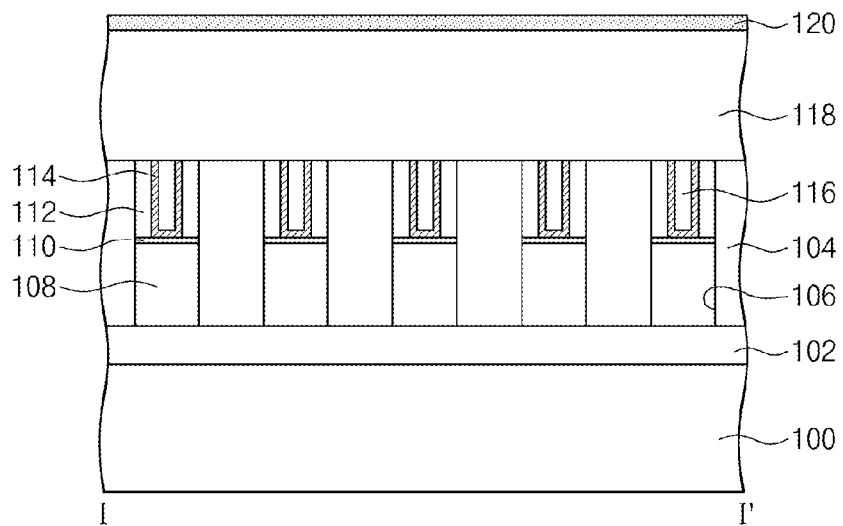

Referring to FIGS. 2 and 3, a substrate 100 is prepared/provided. The substrate 100 may comprise a single-crystalline semiconductor material. For example, the substrate 100 may be a silicon substrate, a silicon-on-insulator (SOI) substrate, a germanium substrate, a germanium-on-insulator (GOI) substrate, or a silicon-germanium (SiGe) substrate. Also, the substrate 100 may be doped with, for example, P-type impurities.

A device isolation layer (not shown) may be formed in the substrate 100 to define active regions. Word lines 102 may be formed in the active regions, respectively. The word lines 102 may be arranged at equal intervals and thereby space the active regions apart by equal intervals. The word lines 102 may be doped with, for example, N-type impurities. In an example of this embodiment, the word lines 102 are formed by injecting the N-type impurities into upper portions of the substrate 100, respectively.

An interlayer insulating layer 104 may be formed on the substrate 100. The interlayer insulating layer 104 may be patterned to form first openings 106. The first openings 106 may expose the word lines 102. The interlayer insulating layer 104 may comprise a silicon oxide layer and/or a silicon nitride layer.

A selective epitaxial growth (SEG) process may be performed using the word lines 102 exposed by the first openings 106 as a seed. A semiconductor layer may be formed to partially fill each of the first openings 106 by the SEG process. Impurities may be injected into the semiconductor layer to form a selection element 108. In an example of this embodiment, the selection element 108 is formed by doping the semiconductor layer with impurities having different conductivity types. For example, a lower portion of the semiconductor layer may be doped with N-type impurities to form a first semiconductor pattern of the selection element 108, and an upper portion of the semiconductor layer may doped with P-type impurities to form a second semiconductor pattern of the selection element 108. The second semiconductor pattern may be in contact with a top surface of the first semiconductor pattern. In other words, the selection element 108 may be a diode.

A lower electrode pad 110 may be formed on the selection element 108. The lower electrode pad 110 may include at least one of a metal silicide layer, a metal nitride layer, and a metal layer.

A spacer 112 may be formed on the lower electrode pad 110. In more detail, the spacer 112 may expose a portion of a top surface of the lower electrode pad 110 and may line sides of the first opening 106 on the lower electrode pad 110. The spacer 112 may comprise a silicon oxide layer.

A lower electrode 114 may be formed in each of the first openings 106 to conformally cover the exposed top surface of the lower electrode pad 110 and the spacer 112. The lower electrode 114 may include at least one of Ti, TiSi$_x$, TiN, TiON, TiW, TiAlN, TiAlON, TiSiN, TiBN, W, WSi$_x$, WN, WON, WSiN, WBN, WCN, Ta, TaSi$_x$, TaN, TaON, TaAlN, TaSiN, TaCN, Mo, MoN, MoSiN, MoAlN, NbN, ZrSiN, ZrAlN, Ru, CoSi, NiSi, a conductive carbon-based material, and Cu. In FIG. 3, the lower electrode 114 is shown as having a U-shaped cross section. However, the inventive concepts are not limited to forming the lower electrode 114 in the shape illustrated in FIG. 3.

A filling insulation pattern 116 may be formed on the lower electrode 114 to fill what remains of the first opening 106. The filling insulation pattern 116 may be formed of the same material as the interlayer insulating layer 104. For example, the filling insulation pattern 116 comprises silicon oxide or silicon nitride.

A mold layer 118 is formed on the interlayer insulating layer 104. The mold layer 118 may include at least one of SiO$_x$, SiN, SiON, SICN, TiO, ZrO$_x$, MgO$_x$, HfO$_x$, and AlO$_x$.

A sacrificial layer 120 is formed on the mold layer 118. The sacrificial layer 120 may include at least one of gallium nitride (GaN), titanium nitride (TiN), aluminum-silicon (Al—Si), silicon (Si), germanium (Ge), crystalline aluminum nitride (crystalline AlN), amorphous aluminum nitride (amorphous AlN), amorphous silicon carbide (amorphous SiC), aluminum (Al), tungsten (W), chrome (Cr), nickel (Ni), and copper (Cu).

Figure 4:
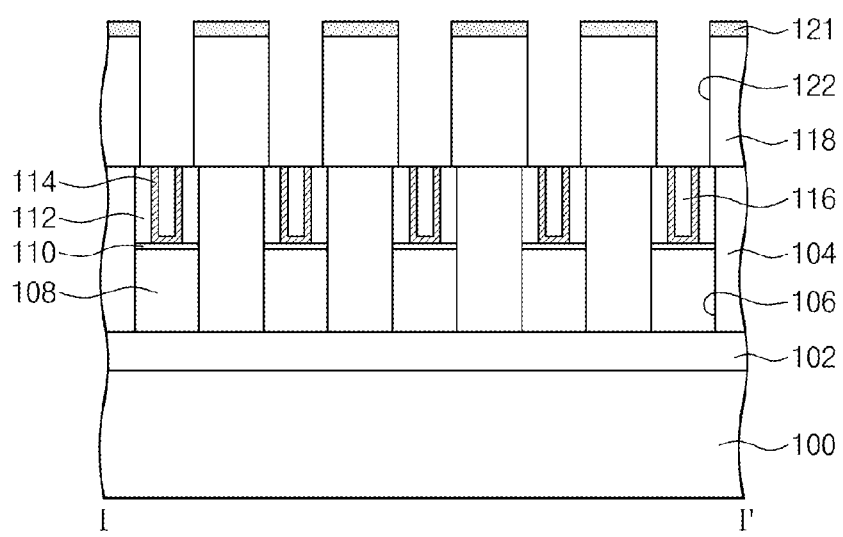

Referring to FIG. 4, the sacrificial layer 120 and the mold layer 118 are patterned to form second openings 122. As a result, a sacrificial pattern 121 is formed on the mold layer 118. The second openings 122 may extend through the sacrificial pattern 121 and the mold layer 118. More specifically with respect to this process, a mask (not shown) may be formed on the sacrificial layer 120, and the sacrificial layer 120 and the mold layer 118 may be etched using the mask as an etch mask to form the second openings 122 which expose the lower electrodes 114, respectively. At this time, portions of the sacrificial layer 120 exposed by the mask are etched to form the sacrificial pattern 121. The sacrificial layer 120 and the mold layer 118 may be etched by a dry etching process or a wet etching process.

Figure 5:
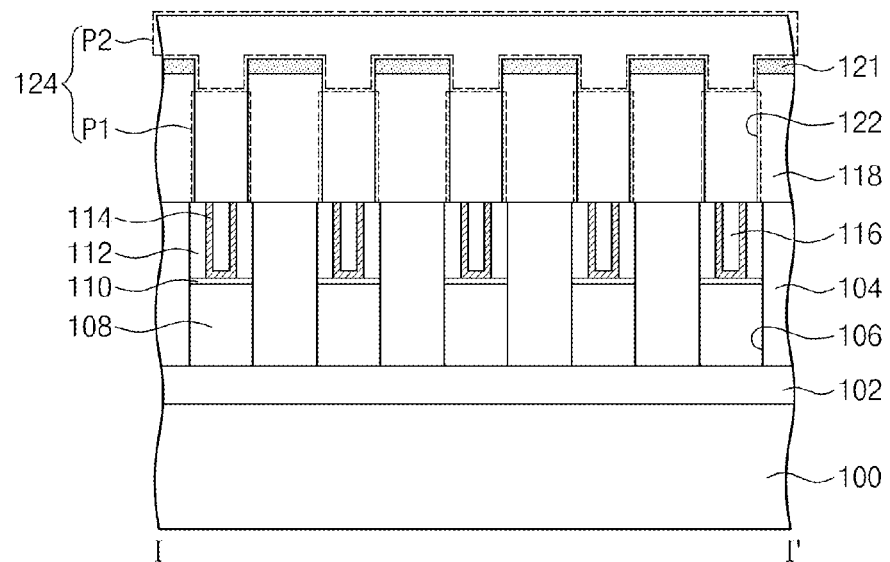

Referring to FIG. 5, a variable resistance layer 124 is formed on the mold layer 118. The variable resistance layer 124 may fill the second openings 122 and may cover a top surface of the sacrificial pattern 121. The variable resistance layer 124 may thus include a first portion P1 occupying each of the second openings 122, and a second portion P2 which extends over a top surface of the mold layer 118. The variable resistance layer 124 may be formed of a phase-change material including at least one of tellurium (Te) and selenium (Se). For example, the variable resistance layer 124 may comprise at least one of GeSbTe, GeTeAs, SnTeSn, GeTe, SbTe, SeTeSn, GeTeSe, SbSeBi, GeBiTe, GeTeTi, InSe, GaTeSe, InSe, GaTeSe, and InSbTe. In addition, the variable resistance layer 124 may be doped with impurities (e.g., carbon (C), nitrogen (N), silicon (Si), oxygen (O), or boron (B)).

Figure 6:
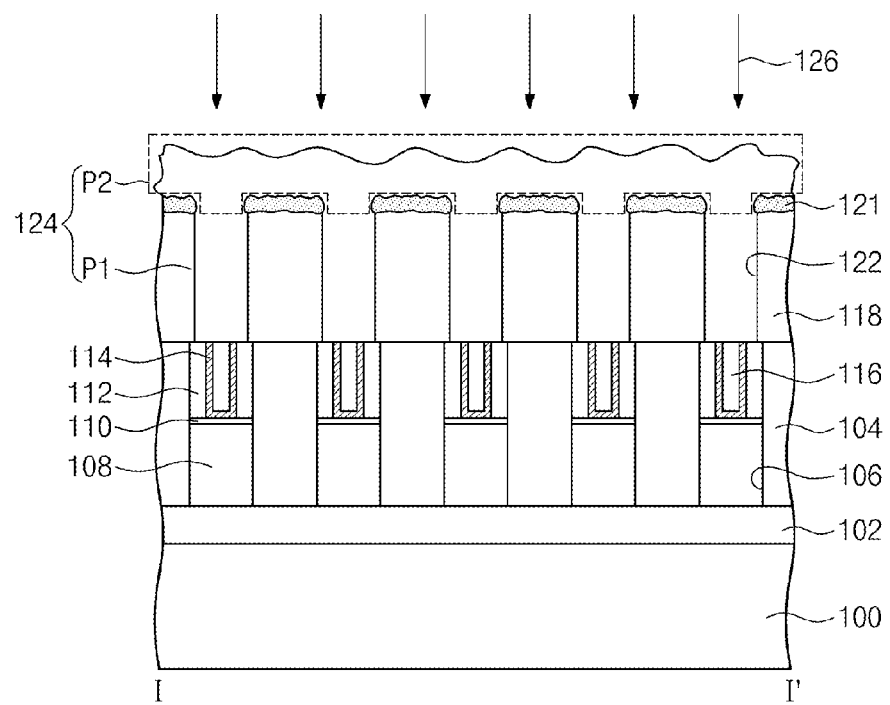
Figure 7:
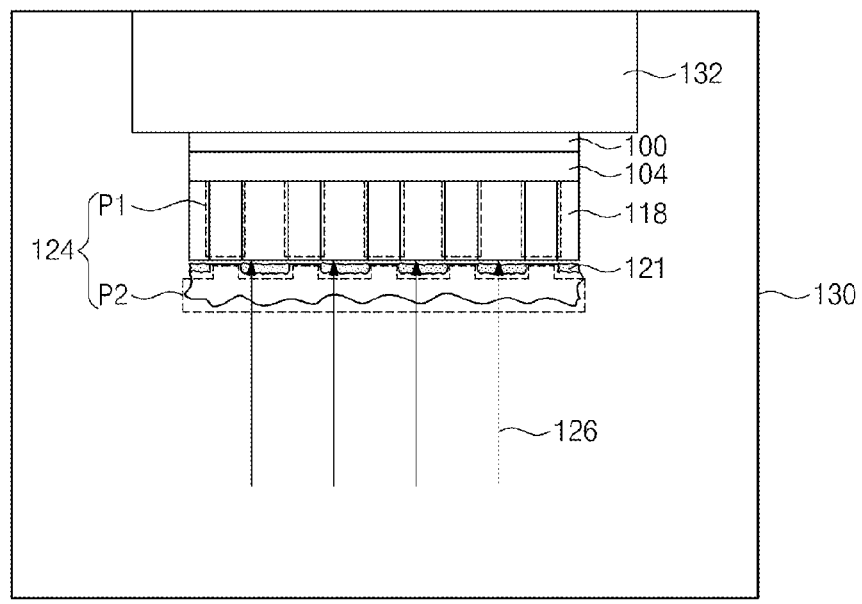

Referring to FIGS. 6 and 7, the variable resistance layer 124 may be irradiated by light amplified by the stimulated emission of electromagnetic radiation, referred to hereinafter as laser light 126. In more detail, the substrate 100 having the variable resistance layer 124 may be fixed to a support 132 in a chamber 130 of processing apparatus. The support 132 may be disposed in an upper region of the chamber 130. For example, the support 132 may be disposed on a bottom surface of a top plate of the chamber 130. The substrate 100 is fixed to the support 132 such that a top surface of the variable resistance layer 124 faces a bottom plate of the chamber 130. Laser light 126 is emitted from a lower region of the chamber 130 so as to be applied to the variable resistance layer 124 and the sacrificial pattern 121 which are disposed in the upper region of the chamber 130. The laser light 126 melts the sacrificial pattern 121 even though it is incident on the top surface of the variable resistance layer 124. In this case, the second portion P2 of the variable resistance layer 124 may also be melted by the laser light 126.

In an example of this embodiment, the sacrificial pattern 121 is formed of GaN, and the laser light 126 decomposes the GaN of the sacrificial pattern 121 into gallium (Ga) and nitrogen (N). At this time, the gallium (Ga) may have a liquid state. Once the sacrificial pattern 121 is melted it can be readily separated from the mold layer 118. Furthermore, at this time, a portion of the variable resistance layer 124 adjacent to the sacrificial pattern 121 may be separated from the remainder of the variable resistance layer 124 along a line proximate an interface between the sacrificial pattern 121 and the mold layer 118. More specifically, because the top surface of the variable resistance layer 124 faces the bottom plate of the chamber 130, gravity acts to separate the sacrificial pattern 121 from the mold layer 118 once the sacrificial pattern 121 is sufficiently melted and, at the same time, the second portion P2 of the variable resistance layer 124 separates from the first portion P1.

Furthermore, in an example of this embodiment, the laser that emits the light 126 used to melt the sacrificial pattern 121 may be solid state laser. The solid state laser may have a wavelength of about 500 nm to about 1200 nm An example of the solid state laser is an aluminum-garnet (YAG) laser that uses a YAG crystal doped with neodymium (Nd) and ytterbium (Yb) as a medium. In examples of the present embodiment, the laser irradiation process may be performed using laser light 126 having a wavelength in a range of about 500 nm to about 600 nm or of about 1000 nm to about 1200 nm with an energy density of 0.3 J/cm$^2$ to 4 J/cm$^2$ for a process time of 300 ns to 1200 ns.

In addition, a reaction gas (e.g., $H_2$, $N_2$, or $O_2$) or an inert gas (e.g., He, Ne, Ar, or Kr) may be introduced into the chamber 120, the temperature within the chamber 130 may be regulated to be within a range from room temperature (e.g., about 20° C.) to about 600° C., and the pressure within the chamber 130 may be regulated to be within a range of $10^{-8}$ torr to 1 atm to form a process atmosphere when the laser light 126 is applied to the variable resistance layer 124. In the example of the present embodiment in which the reaction gas is used, the reaction gas acts as an accelerator of a chemical reaction between materials of the variable resistance and mold layers 124 and 18 which causes the variable resistance layer 124 to readily separate from the mold layer 118. The inert gas may be used when different materials of the layers 124 and 118 do not react with each other.

Figure 8:
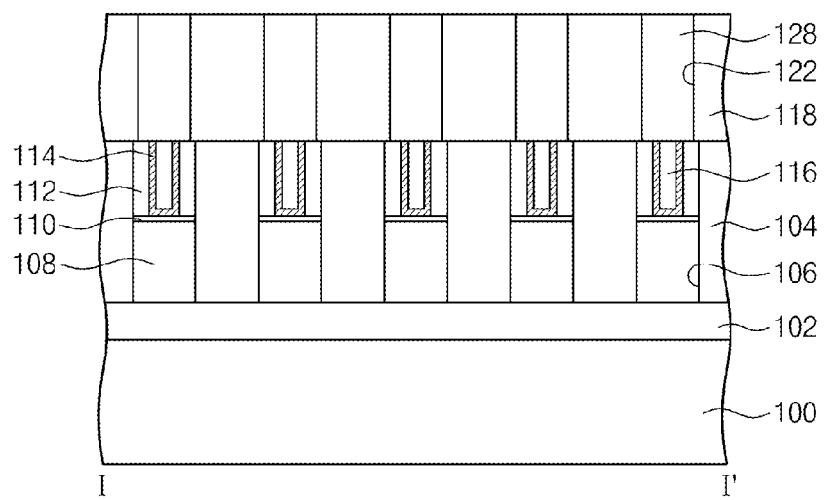
Figure 9:
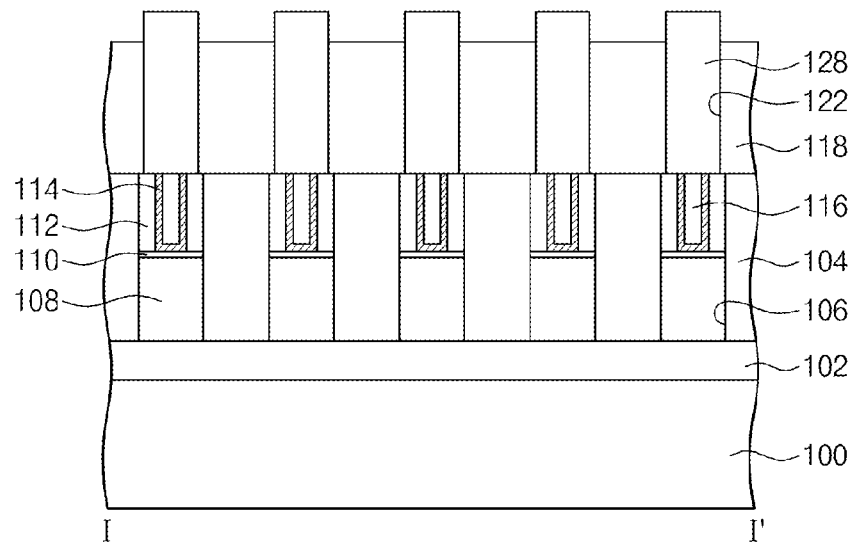
Figure 10:
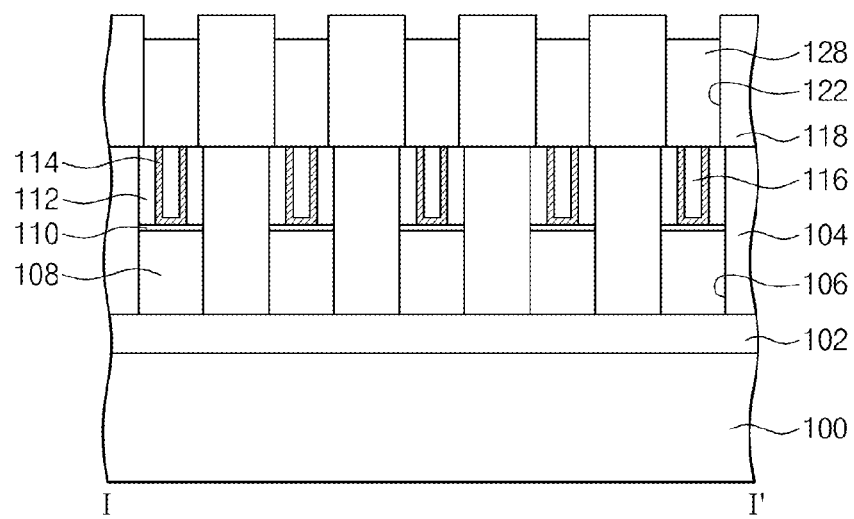

Referring to FIGS. 8 to 10, as a result of the process described above, a variable resistance element 128 is formed in each of the second openings 122. Also, the top surface of the mold layer 118 may be exposed. The height of the variable resistance element 128 depends on the line along which the upper portion of the variable resistance layer 124 separates from the lower portion.

For instance, as shown in FIG. 8, the top surface of the variable resistance element 128 may be disposed at the same level as the top surface of the mold layer 118. In this case, the variable resistance layer 124 has separated approximately along the line between the first portion P1 and the second portion P2 of the variable resistance layer 124 described above.

On the other hand, as shown in FIG. 9, the top surface of the variable resistance element 128 may be higher than the top surface of mold layer 118. In this case, the variable resistance layer 124 has separated within the second portion P2 of the variable resistance layer 124.

And, as shown in FIG. 10, the top surface of the variable resistance element 128 may be lower than the top surface of the mold layer 118. In this case, the variable resistance layer 124 separated within the first portion P1 of the variable resistance layer 124.

Furthermore, and although not shown in drawings, in any of these cases the top surface of the variable resistance element 128 may be rough due to the above-described mechanism by which the upper portion of the variable resistance layer 124 is physically separated from the remainder of the variable resistance layer 124.

Generally, a damascene process has been used to form a variable resistance element in each of memory cells. In a damascene process, a variable resistance layer is formed on a mold layer to fill openings in a mold layer, and the portion of the variable resistance layer which lies outside the openings is etched by a dry etching process or a chemical mechanical polishing (CMP) process to leave remnants of the variable resistance layer as variable resistance elements in the openings. The dry etching process typically uses a halogen gas as the etchant. In this case, a halogen element of the gas can combine with an element of the variable resistance layer such that characteristics of the variable resistance layer are changed by the etching process. The CMP process uses particulate slurry to polish the variable resistance layer. However, the type of slurry particles and the composition of the slurry must be tailored to the type and density of the material of the variable resistance layer and so the use of the CMP process requires a good deal of technical expertise.

On the other hand, according to aspects of the inventive concepts, a solid state laser may be used to form variable resistance elements by irradiating the variable resistance layer for only a relatively short amount of time. Therefore, any changes in characteristics of the material of the variable resistance layer 124 are minimal, and there is wide freedom in the process such that the process can be readily adapted to various types of variable resistance material.

Figure 11:
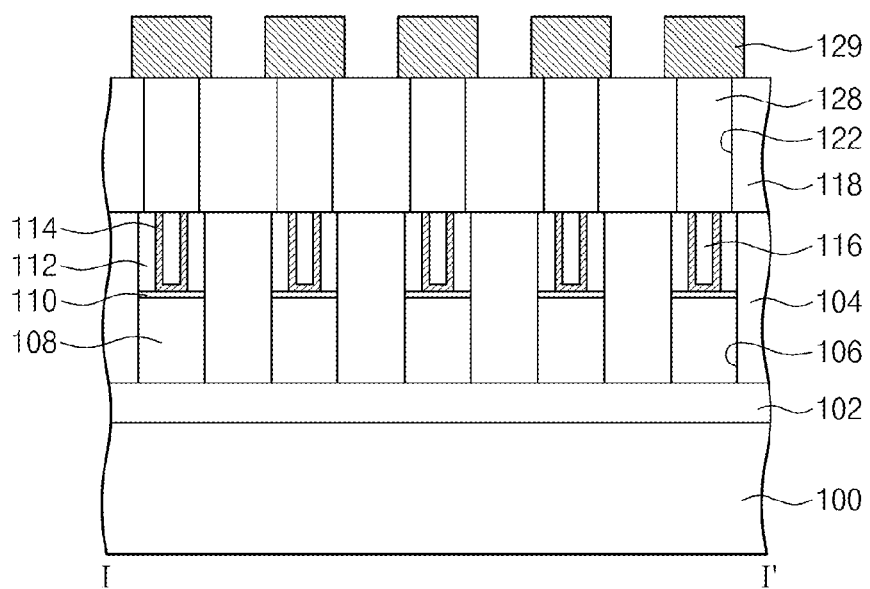
Figure 12:
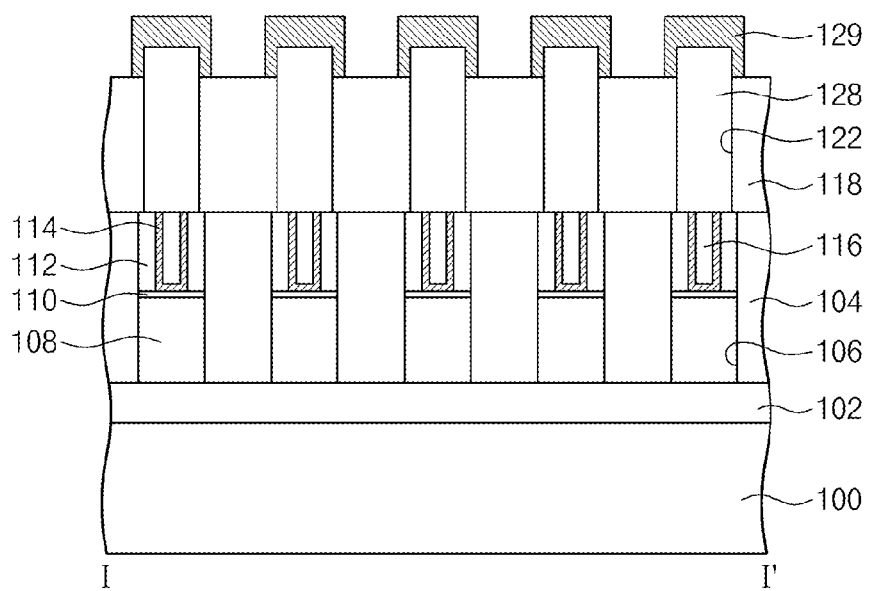
Figure 13:
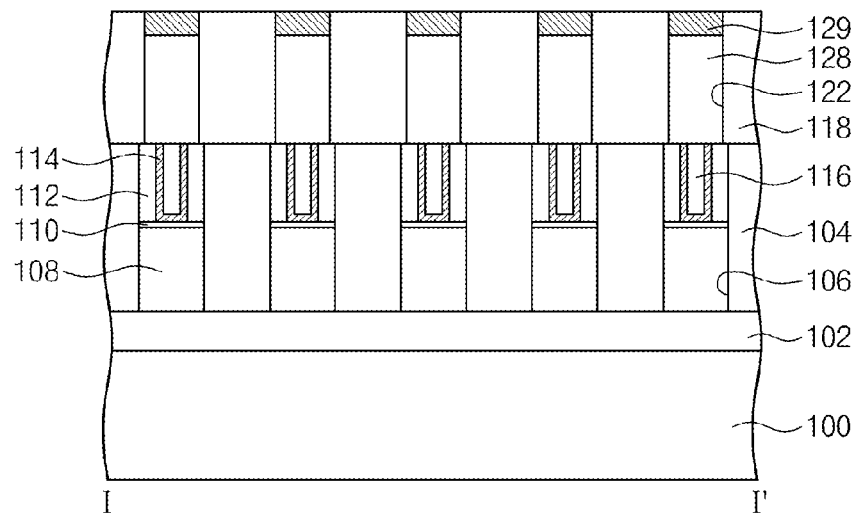

Next, and with reference to FIGS. 11 to 13, bit lines 129 may be formed on the mold layer 118 to cover the variable resistance elements 128. The bit lines 129 may cross over the word lines 102. The bit lines 129 comprise conductive material. In an example of this embodiment, metal is deposited on the mold layer 118, and the resulting metal layer is patterned to form the bit lines 129.

In the example of FIG. 11, the bit lines 129 are formed to cover top surfaces of the variable resistance elements 128 when the structure shown in and described with reference to FIG. 8 is formed.

In the example of FIG. 12, the bit lines 129 are formed to cover the top surfaces and exposed sides of the variable resistance elements 128 when the structure shown in and described with reference to FIG. 9 is formed.

In the example shown in FIG. 13, the bit lines 129 are formed in the second openings 122 to cover the top surfaces of the variable resistance elements 128 when the structure shown in and described with reference to FIG. 10 is formed. In this case, especially, the second openings 122 were formed to comprise grooves extending linearly in a direction parallel to an upper surface of the substrate 100 and the bit lines 29 are formed in the grooves.

A second embodiment of a method of fabricating a variable resistance memory device according to the inventive concepts will now be described with reference to FIGS. 14 to 17. To avoid redundancy, descriptions of the processes that this embodiment has in common with the first embodiment will be omitted or mentioned briefly.

Figure 14:
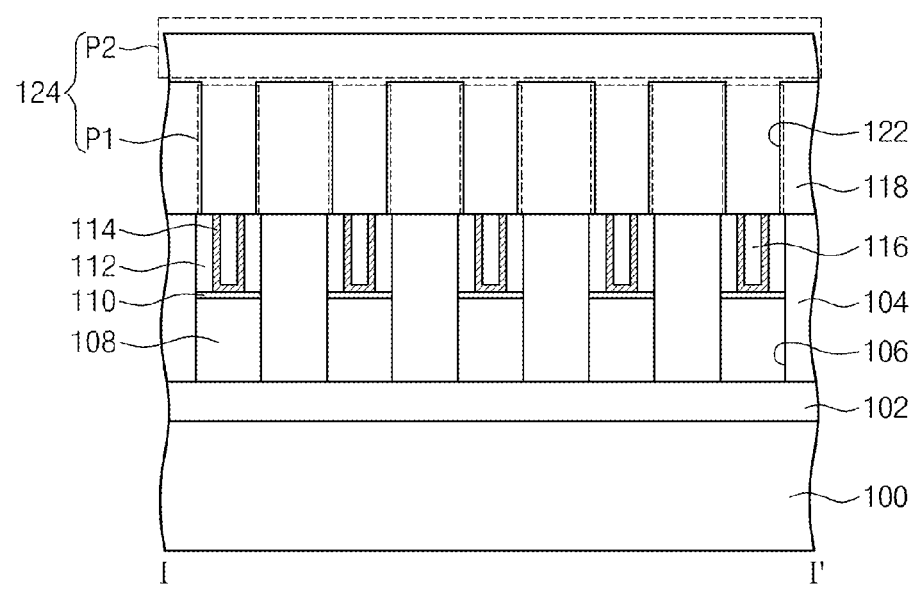
FIGS. 14 to 17 illustrate a second embodiment of a method of fabricating a variable resistance memory device according to the inventive concepts with each of FIGS. 14, 15, 16 and 17 being a cross-sectional view of the device during the course of its manufacture as taken along the direction of line I-I' of FIG. 2.

Referring to FIG. 14, mold layer 118 is patterned to form second openings 122. The second openings 122 expose top surfaces of lower electrodes 114. Variable resistance layer 124 is formed directly on the mold layer 118. The variable resistance layer 124 may fill the second openings 122 and may cover the top surface of the mold layer 118 so as to be in contact with the top surface. The variable resistance layer 124 has first portion P1 which fills each of the second openings 122, and a second portion P2 which extends over the top surface of the mold layer 118.

Figure 15:
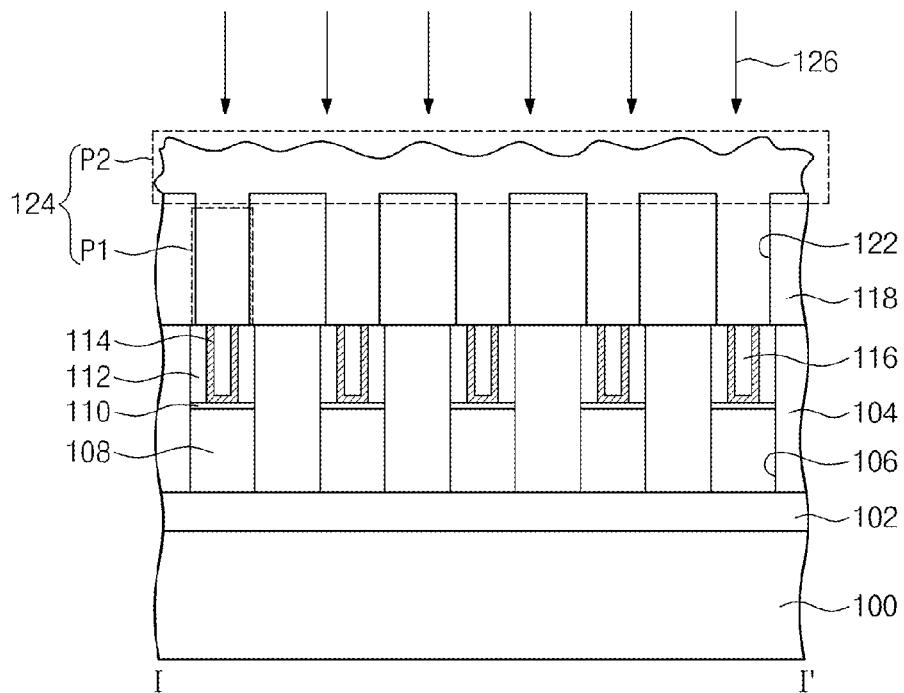

Referring to FIG. 15, laser light 126 is directed onto the variable resistance layer 124 to increase the temperature of the variable resistance layer 124. Thus, part of the variable resistance layer 124 may be melted or vaporized by the laser light 126. More specifically, the variable resistance layer 124 may be heated such that the temperature of the second portion P2 is so much higher than the temperature of the first portion P1 (T2>T1) that the second portion P2 of the variable resistance layer 124 is melted and/or vaporized whereas the first portion P1 remains solid or semi-solid.

In this example, the process atmosphere within chamber 130 may contain a reaction gas (e.g., $H_2$, $N_2$, or $O_2$) or an inert gas (e.g., He, Ne, Ar, or Kr) at a process temperature ranging from room temperature to about 600° C. and at a process pressure of $10^{-8}$ torr to 1 atm. In examples of this embodiment, the irradiation process is performed using laser light 126 having a wavelength of about 500 nm to about 600 nm or of about 1000 nm to about 1200 nm with an energy density of 0.3 J/cm² to 4 J/cm² for a process time of 300 ns to 1200 ns.

Figure 16:
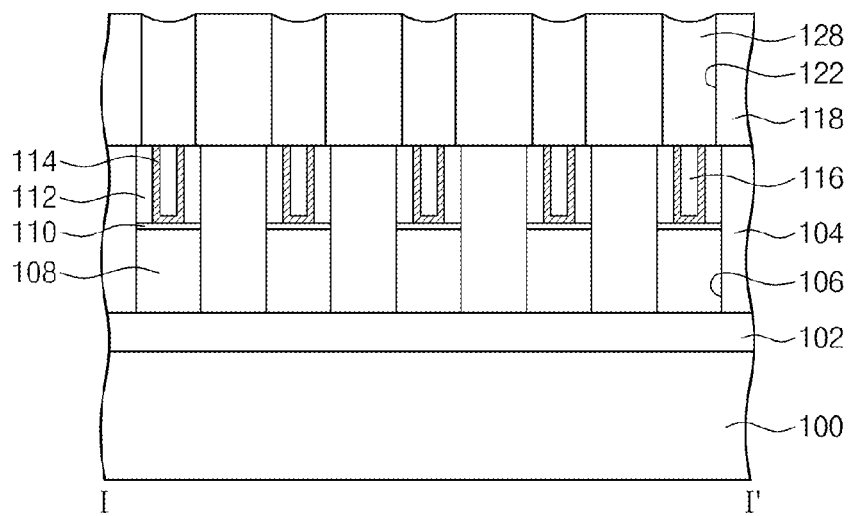

Referring to FIG. 16, as a result of the melting away or evaporation of the second portion P2 of the variable resistance layer 124, a variable resistance element 128 is formed in each of the second openings 122. The separation occurs more easily at an interface between layers of different materials (the interface between variable resistance layer 124 and mold layer 118) than along a line within a body of material (a line between portions P2 and P1 of the variable resistance layer 124). Thus, the second portion P2 of the variable resistance layer 124 separates from the top surface of the mold layer 118 than it does from the first portion P1. As a result, the variable resistance element 128 may have a concave top surface.

In an example of the present embodiment, the second portion P2 of the variable resistance layer 124 may be separated from the mold layer 118 and from the first portion P1 of the variable resistance layer 124 by irradiating the variable resistance layer 124 for a relatively short time using a solid state laser. Thus, any changes in the material of the variable resistance layer 124 may be minimal in forming the variable resistance element 128 such that the variable resistance element 128 possesses excellent reliability.

Figure 17:
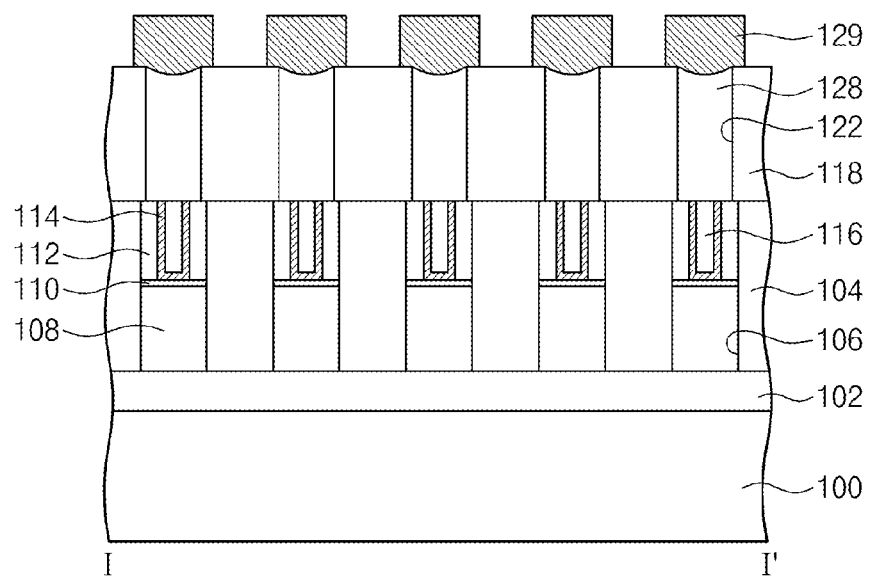

Referring to FIG. 17, bit lines 129 may be formed on the mold layer 118 to cover the variable resistance elements 128.

A third embodiment of a method of fabricating a variable resistance memory device according to the inventive concepts will now be described with reference to FIGS. 18 to 21. To avoid redundancy, descriptions of the processes that this embodiment has in common with the first and second embodiments will be omitted or mentioned briefly.

Figure 18:
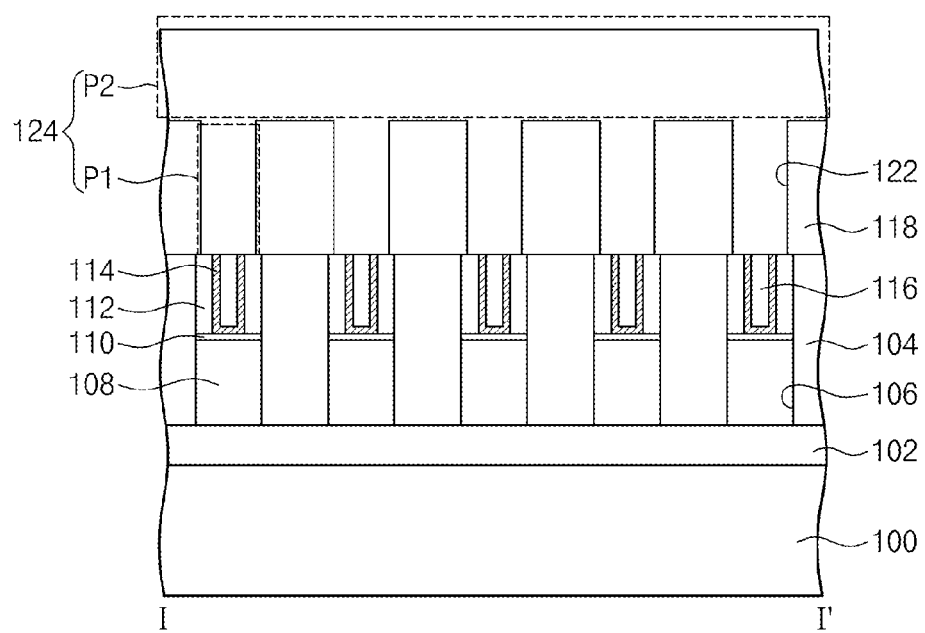
FIGS. 18 to 21 illustrate a third embodiment of a method of fabricating a variable resistance memory device according to the inventive concepts with each of FIGS. 18, 19, 20 and 21 being a cross-sectional view of the device during the course of its manufacture as taken along the direction of line I-I' of FIG. 2.

Referring to FIG. 18, mold layer 118 is patterned to form second openings 122. Variable resistance layer 124 is formed directly on the mold layer 118. The variable resistance layer 124 fills the second openings 122 and covers the top surface of the mold layer 118. Thus, the top surface of the mold layer 118 contacts the variable resistance layer 124.

Figure 19:
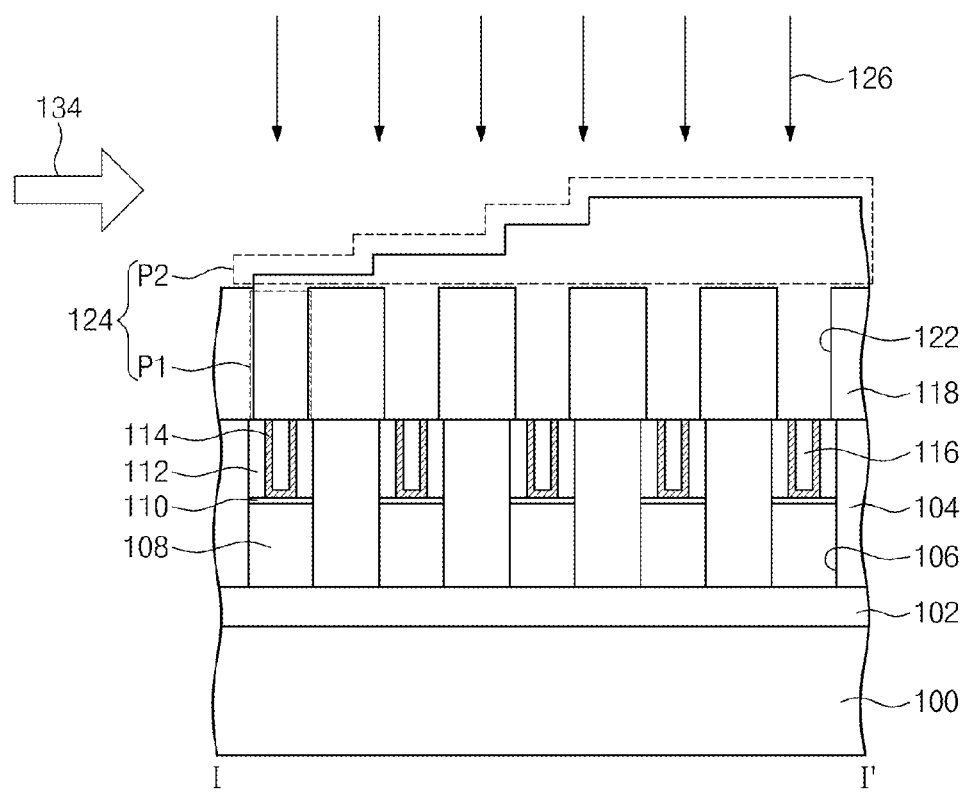

Referring to FIG. 19, the laser light 126 and a gas 134 are directed towards the variable resistance layer 124 at the same time. The laser light 126 is directed onto the top surface of the variable resistance layer 124, and the gas 134 is injected, in the form of a jet, sideways onto the variable resistance layer 134 (in a direction having at least a component parallel to the top surface of the variable resistance layer). The gas 134 may be air.

The variable resistance layer 124 is melted by the laser light 126 to such a degree that at least the second portion P2 of the variable resistance layer 124 has fluidity. Thus, the second portion P2 of the variable resistance layer 124 may flow along the direction in which the jet of gas 134 flows. In this example, at least part of the first portion P1 of the variable resistance layer 124 also becomes fluid but remains adhered to an inner sidewall surface of the mold layer 118 (the surface delimiting the second opening 122) by a capillary phenomenon. The second portion P2 of the variable resistance layer 124 may be removed through an exhaust port (not shown) in a side of the chamber 130 (FIG. 7) opposite the side of the chamber 130 from which the gas 134 is injected (through an injection nozzle, not shown) towards the variable resistance layer 124.

In this embodiment, the process atmosphere within chamber 130 may also contain a reaction gas (e.g., $H_2$, $N_2$, or $O_2$) or an inert gas (e.g., He, Ne, Ar, or Kr) at a process temperature ranging from room temperature to about 600° C. and at a process pressure of $10^{-8}$ torr to 1 atm. In examples of this embodiment, the irradiation process is performed using laser light 126 having a wavelength of about 500 nm to about 600 nm or of about 1000 nm to about 1200 nm with an energy density of 0.3 J/cm² to 4 J/cm2 for a process time of 300 ns to 1200 ns.

Figure 20:
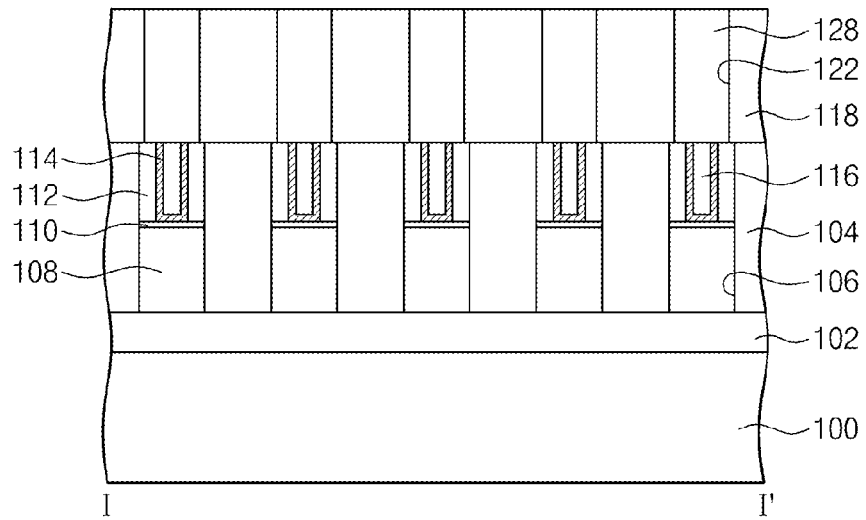
Figure 21:
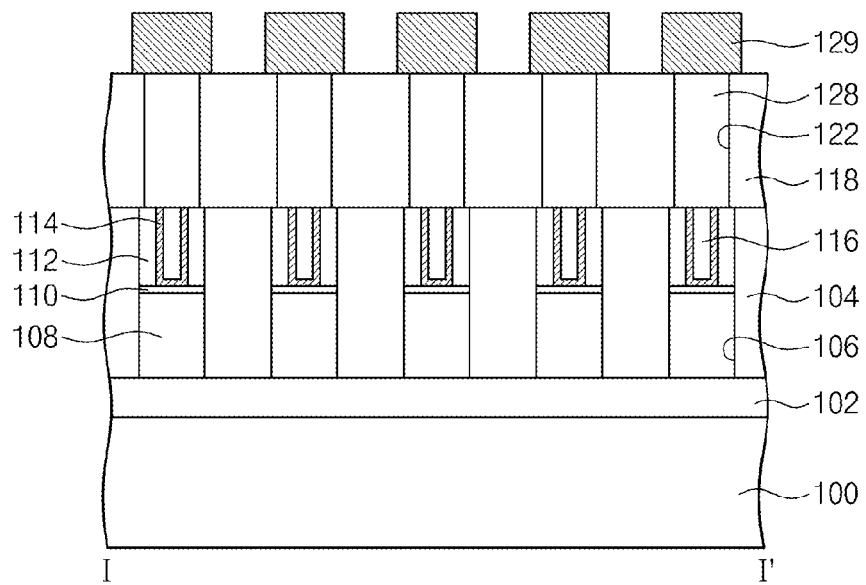

Referring to FIGS. 20 and 21, once the second portion P2 of the variable resistance layer 124 has been removed to form a variable resistance element 128 in each of the second openings 122, bit lines 129 may be formed on the variable resistance elements 128.

A fourth embodiment of a method of fabricating a variable resistance memory device according to the inventive concepts will be described with reference to FIGS. 22 to 25. To avoid redundancy, descriptions of the processes that this embodiment has in common with the first, second and third embodiments will be omitted or mentioned briefly.

Figure 22:
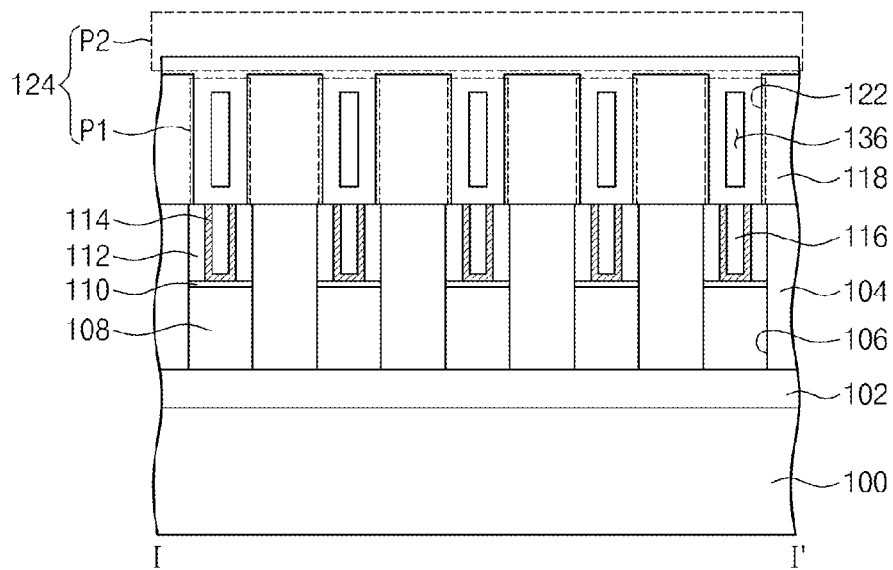
FIGS. 22 to 25 illustrate a fourth embodiment of a method of fabricating a variable resistance memory device according to the inventive concepts with each of FIGS. 22, 23, 24 and 25 being a cross-sectional view of the device during the course of its manufacture as taken along the direction of line I-I' of FIG. 2.

Referring to FIG. 22, mold layer 118 is patterned to form second openings 122. Variable resistance layer 124 is formed on the mold layer 118. The variable resistance layer 124 occupies the second openings 122 and covers the top surface of the mold layer 118. In the present embodiment, the variable resistance layer 124 only partially fills the second openings 122. Thus, the first portion P1 of the variable resistance layer 124 may have pockets of air 136. The variable resistance layer 124 may be formed by, for example, a physical vapor deposition (PVD) process.

Figure 23:
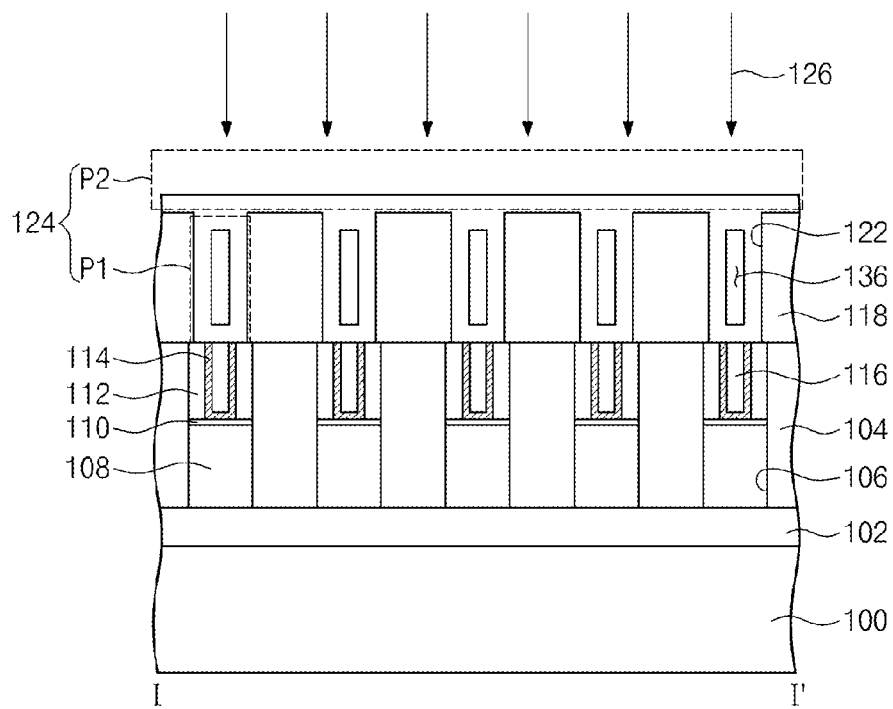
Figure 24:
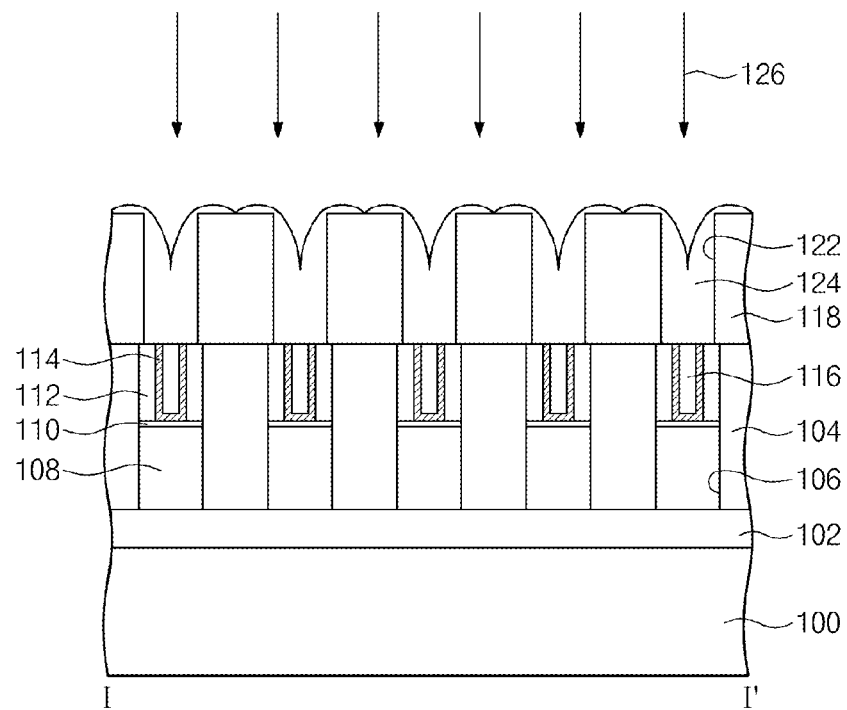

Referring to FIGS. 23 and 24, laser light 126 is directed onto the variable resistance layer 124. The variable resistance layer 124 is melted by the laser light 126 to such a degree as to have fluidity. Thus, the variable resistance layer 124 flows within the second openings 122 to fill the air pockets 136.

In this embodiment as well, the process atmosphere within chamber 130 may also contain a reaction gas (e.g., $H_2$, $N_2$, or O₂) or an inert gas (e.g., He, Ne, Ar, or Kr) at a process temperature ranging from room temperature to about 600° C. and at a process pressure of $10^{-8}$ torr to 1 atm. In examples of this embodiment, the irradiation process is performed using laser light 126 having a wavelength of about 500 nm to about 600 nm or of about 1000 nm to about 1200 nm with an energy density of 0.3 J/cm² to 4 J/cm2 for a process time of 300 ns to 1200 ns.

Figure 25:
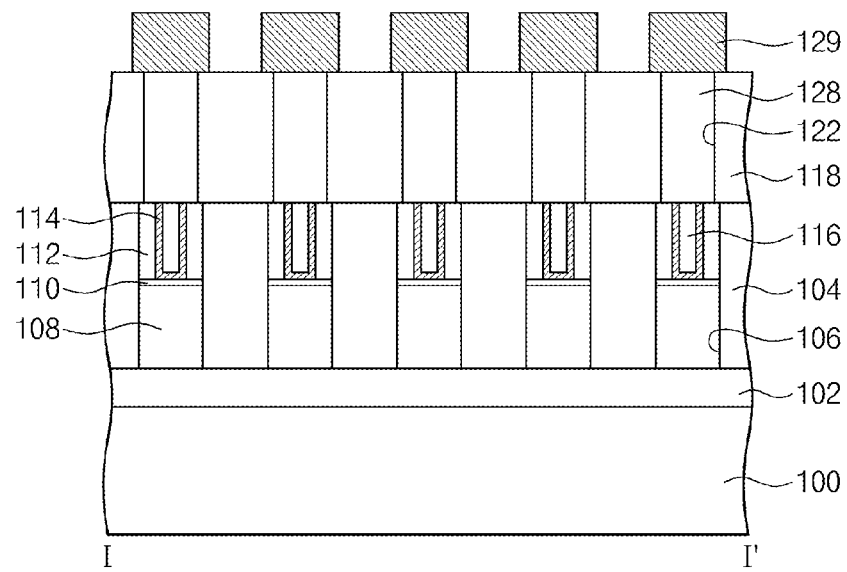

Referring to FIG. 25, all of the second portion P2 of the variable resistance layer 124 may flow into the second openings 122 to form variable resistance elements 128 filling the second openings 122. The top surface of the mold layer 118 may be exposed as a result. Bit lines 129 may then be formed on the variable resistance elements 128.

Figure 26:
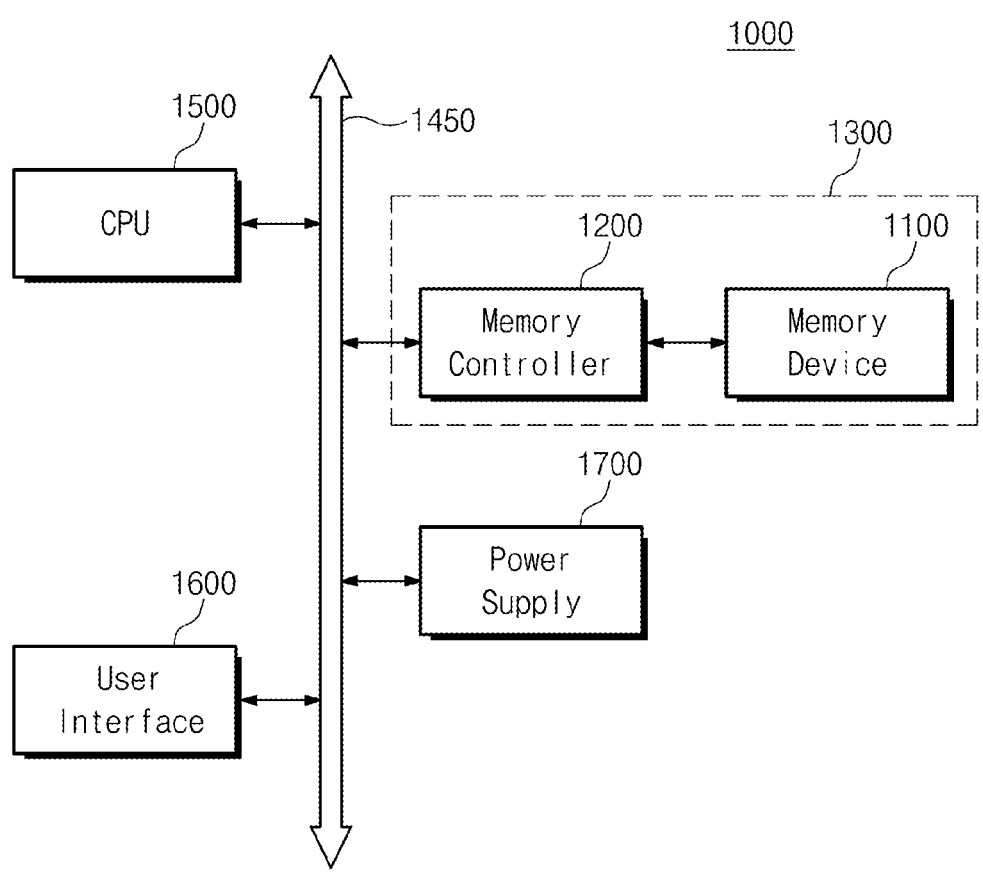
FIG. 26 is a schematic block diagram of an electronic device including a variable resistance memory device fabricated according to the inventive concepts.

FIG. 26 illustrates an electronic device including a variable resistance memory device fabricated by an embodiment according to the inventive concepts.

The electronic device 1000 may be that of an application chipset, a camera image processor (CIS), a personal digital assistant (PDA), a laptop computer, a portable computer, a web tablet, a wireless phone, a mobile phone, a digital music player, a cable/wireless electronic device, or for that matter any complex electronic device including at least two components performing different functions of select ones of the aforementioned products.

Referring to FIG. 26, the electronic device 1000 may include a semiconductor memory system 1300, a central processing unit (CPU) 1500, a user interface unit 1600, and a power supply 1700 which are electrically connected to a system bus 1450. The semiconductor memory system 1300 include a memory device 1100 (e.g., a PRAM device) fabricated according to the inventive concepts, and a memory controller 1200.

Data provided through the user interface unit 1600 and/or data processed by the CPU 1500 may be stored in the memory device 1100 through the memory controller 1200. The memory device 1100 may be constituted by a solid state drive (SSD). In this case, an operating speed of the electronic device 1000 may be markedly fast.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of fabricating a variable resistance memory device, the method comprising:
    providing a substrate on which a lower electrode is disposed;
    forming a mold layer on the substrate;
    patterning the mold layer to form an opening;
    forming a variable resistance layer on the mold layer, the variable resistance layer having a first portion in the opening, and a second portion extending over a top surface of the mold layer; and
    separating the second portion of the variable resistance layer from the first portion to thereby form a variable resistance element in the opening, wherein said separating comprise irradiating the variable resistance using a laser.

2. The method of claim 1, wherein the separating of the second portion of the variable resistance layer from the first portion comprises melting and/or vaporizing only the second of the first and second portions of the variable resistance layer using the laser.

3. The method of claim 1, further comprising:
    forming a sacrificial layer on the mold layer before forming the opening; and
    patterning the sacrificial layer to form a sacrificial pattern on the mold layer.

4. The method of claim 3, wherein the separating of the second portion of the variable resistance layer from the first portion comprises melting the sacrificial pattern using the laser to facilitate a separating of the sacrificial pattern from the mold layer.

5. The method of claim 4, wherein the separating of the second portion of the variable resistance layer from the first portion comprises:
    fixing the substrate to a support disposed in an upper region of a chamber with the mold layer facing a lower region of the chamber; and
    irradiating the variable resistance layer with laser light propagating to the variable resistance layer from a lower region of the chamber;
    wherein the sacrificial pattern is separated from the mold layer under force of gravity and, at the same time, the second portion of the variable resistance layer separates from the first portion.

6. The method of claim 3, wherein the sacrificial layer is formed of at least one material selected from the group consisting of gallium nitride (GaN), titanium nitride (TiN), aluminum-silicon (Al—Si), silicon (Si), germanium (Ge), crystalline aluminum nitride (crystalline AlN), amorphous aluminum nitride (amorphous AlN), amorphous silicon carbide (amorphous SiC), aluminum (Al), tungsten (W), chrome (Cr), nickel (Ni), and copper (Cu).

7. The method of claim 1, wherein the variable resistance element is formed so as to have a concave top surface.

8. The method of claim 1, wherein the laser is solid state laser.

9. The method of claim 8, wherein the solid state laser is aluminum-garnet (YAG) laser.

10. The method of claim 1, wherein the laser has a wavelength of about 500 nm to about 1200 nm, and
    wherein the laser irradiates the variable resistance layer with an energy density of 0.3 J/cm² to 4 J/cm² for a process time of 300 ns to 1200 ns.

11. The method of claim 1, wherein the separating of the second portion of the variable resistance layer from the first portion further comprises:
    while the variable resistance layer is being irradiated using the laser, directing a gas jet onto the variable resistance layer in such a direction that the second portion flows in a direction across the substrate so as to separate from the first portion.

12. A method of fabricating a variable resistance memory device, the method comprising:
    forming a mold layer on the substrate;
    patterning the mold layer to form an opening in the mold layer;
    forming a blanket variable resistance layer on the mold layer to such a thickness that the variable resistance layer extends within the opening and across a top surface of the mold layer, wherein the variable resistance layer is of material whose resistance changes with changes in voltage impressed thereacross and/or current supplied thereto; and
    forming a variable resistance element in the opening by removing at least all of the variable resistance layer that extends across the top surface of the mold layer and leaving some of the variable resistance layer within the opening, wherein the forming of the variable resistance element comprises irradiating the variable resistance layer.

13. The method of claim 12, further comprising:

forming a sacrificial layer on the mold layer before forming the opening in the mold layer; and patterning the sacrificial layer to form a sacrificial pattern on the mold layer before the variable resistance layer is formed, wherein the variable resistance layer is formed on the sacrificial layer pattern, and the forming of the variable resistance element comprises melting the sacrificial layer pattern, and while the sacrificial layer pattern is molten removing the sacrificial pattern from the mold layer along with at least that part of the variable resistance layer that is disposed on the sacrificial layer pattern.

14. The method of claim 13, wherein the forming of the variable resistance element comprises supporting the substrate with the variable resistance layer facing downwardly while the sacrificial layer pattern is being melted such that the sacrificial layer pattern falls away from the mold layer after it is melted.

15. The method of claim 13, wherein the forming of the variable resistance element comprises vaporizing at least all of the variable resistance layer that extends across the top surface of the mold layer.

16. The method of claim 13, wherein the forming of the variable resistance element comprises:

melting the variable resistance layer in at least a region thereof that is located above the level of the top surface of the mold layer, and while the region of the variable resistance layer is molten, directing a gas jet onto the molten region of the variable resistance layer to push the molten region of the variable resistance layer across the mold layer.

17. The method of claim 13, wherein the variable resistance layer is formed such that it contains an air pocket within the opening in the mold layer, and the forming of the variable resistance element comprises melting at least all of the variable resistance layer that extends across the top surface of the mold layer and causing all of the variable resistance layer that extends over the top surface of the mold layer to flow into the opening, whereby the air pocket in the variable resistance layer within the opening is diminished.

* * * * *